US012604410B2

(12) United States Patent
Tsuyoshi et al.

(10) Patent No.: US 12,604,410 B2
(45) Date of Patent: Apr. 14, 2026

(54) ELECTRONIC COMPONENT

(71) Applicant: TDK Corporation, Tokyo (JP)

(72) Inventors: Atsuhiro Tsuyoshi, Tokyo (JP);
Takashi Ohtsuka, Tokyo (JP); Kenichi Yoshida, Tokyo (JP)

(73) Assignee: TDK Corporation, Tokyo (JP)

( * ) Notice: Subject to any disclaimer, the term of this patent is extended or adjusted under 35 U.S.C. 154(b) by 232 days.

(21) Appl. No.: 18/449,095

(22) Filed: Aug. 14, 2023

(65) Prior Publication Data

US 2023/0397338 A1    Dec. 7, 2023

Related U.S. Application Data

(63) Continuation of application No. PCT/JP2022/005042, filed on Feb. 9, 2022.

(30) Foreign Application Priority Data

Feb. 26, 2021    (JP) ................................. 2021-030890

(51) Int. Cl.
*H05K 1/18* (2026.01)
*H05K 1/185* (2026.01)
*H05K 3/303* (2026.01)
*H05K 3/46* (2006.01)

(52) U.S. Cl.
CPC ............ *H05K 1/188* (2013.01); *H05K 3/305* (2013.01); *H05K 3/4644* (2013.01); *H05K 2201/0183* (2013.01)

(58) Field of Classification Search
CPC ............ H05K 1/18; H05K 1/88; H05K 3/305; H05K 3/4644; H01G 4/40

USPC ......................................................... 361/748
See application file for complete search history.

(56) References Cited

U.S. PATENT DOCUMENTS

| | | | |
|---|---|---|---|
| 2007/0097596 A1 | 5/2007 | Kuwajima et al. | |
| 2007/0120130 A1 | 5/2007 | Kuwajima et al. | |
| 2008/0023219 A1 | 1/2008 | Yoshizawa et al. | |
| 2010/0246090 A1 | 9/2010 | Yoshizawa et al. | |

FOREIGN PATENT DOCUMENTS

| JP | 2002-033239 A | 1/2002 |
|---|---|---|
| JP | 2007-123690 A | 5/2007 |
| JP | 2007-149970 A | 6/2007 |
| JP | 2008-034626 A | 2/2008 |
| JP | 2010-232282 A | 10/2010 |
| JP | 2019-033169 A | 2/2019 |
| JP | 2019-114723 A | 7/2019 |

OTHER PUBLICATIONS

International Search Report issued in related corresponding International Application PCT/JP2022/005042, dated Apr. 19, 2022, with English translation.

*Primary Examiner* — Tremesha W Burns
(74) *Attorney, Agent, or Firm* — Rimon P.C.

(57) ABSTRACT

An electronic component has: a conductor layer M1 formed on a substrate and including lower electrodes of a capacitor; a dielectric film covering the top and side surfaces of each of the lower electrodes; upper electrodes of the capacitor which are formed on the top surfaces of the respective lower electrodes through the dielectric film; and an adhesive film disposed between the dielectric film and the top and side surfaces of each of the lower electrodes. The adhesive film is thus disposed between the dielectric film and the top and side surfaces of each of the lower electrodes.

6 Claims, 7 Drawing Sheets

ELECTRONIC COMPONENT

CROSS REFERENCE TO RELATED APPLICATIONS

This is a Continuation of Application PCT/JP2022/005042, filed on Feb. 9, 2022, which is based upon and claims the benefit of priority from Japanese Patent Application No. 2021-030890, filed on Feb. 26, 2021; the entire contents of which are incorporated herein by reference.

TECHNICAL FIELD

The present disclosure relates to an electronic component and, more particularly, to an electronic component incorporating a capacitor.

BACKGROUND ART

As a chip type electronic component incorporating a capacitor, an electronic component described in Patent Document 1 is known. In this electronic component, two conductor layers are used to constitute a series circuit of a capacitor and an inductor.

CITATION LIST

Patent Document

[Patent Document 1] JP 2008-034626A

DISCLOSURE OF THE INVENTION

Problem to be Solved by the Invention

In the above electronic component described in Patent Document 1, the top and side surfaces of a capacitor lower electrode are directly covered with a dielectric film.

One of the objects of the present disclosure is to provide a technology for providing an electronic component including a capacitor with improved reliability.

Means for Solving the Problem

An electronic component according to the present disclosure includes: a first conductor layer formed on a substrate and including a lower electrode of a capacitor; a dielectric film covering the top and side surfaces of the lower electrode; an upper electrode of the capacitor covering the top surface of the lower electrode with the dielectric film disposed therebetween; and a first adhesive film interposed between the dielectric film and the top and side surfaces of the lower electrode.

MODE FOR CARRYING OUT THE INVENTION

Hereinafter, embodiments of the present disclosure will be described in detail with reference to the accompanying drawings.

Figure 1:
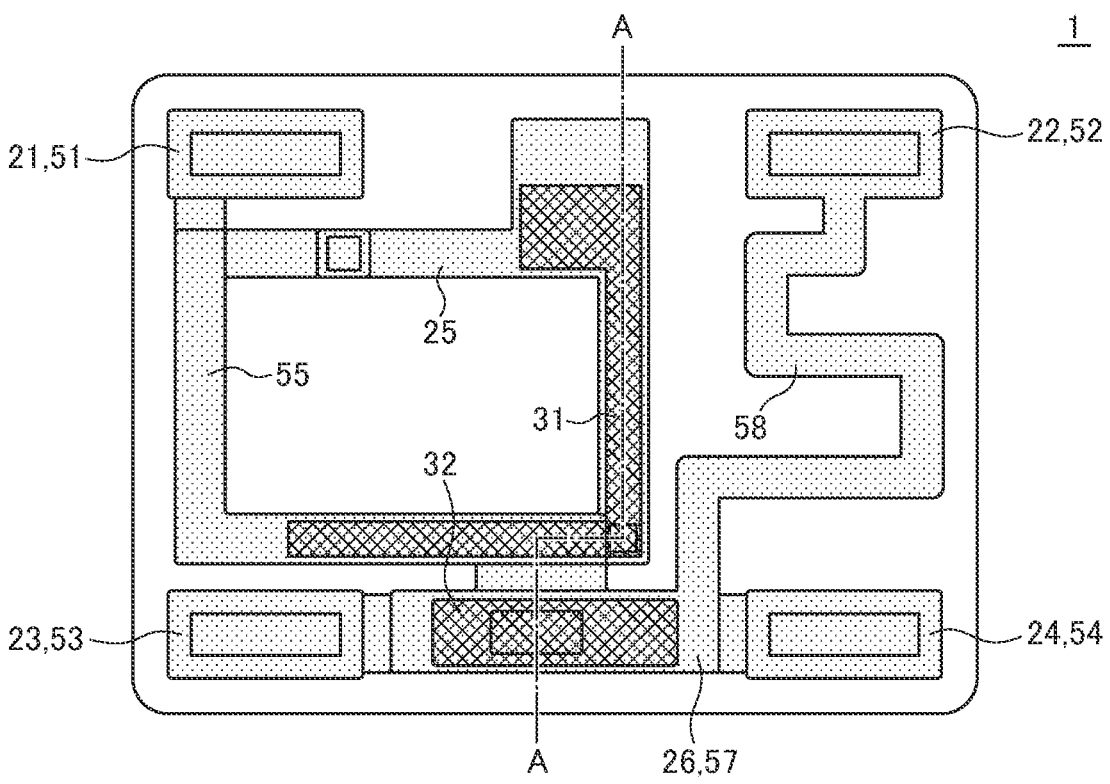
FIG. 1 is a schematic plan view for explaining the structure of an electronic component 1 according to an embodiment of the present disclosure.
Figure 2:
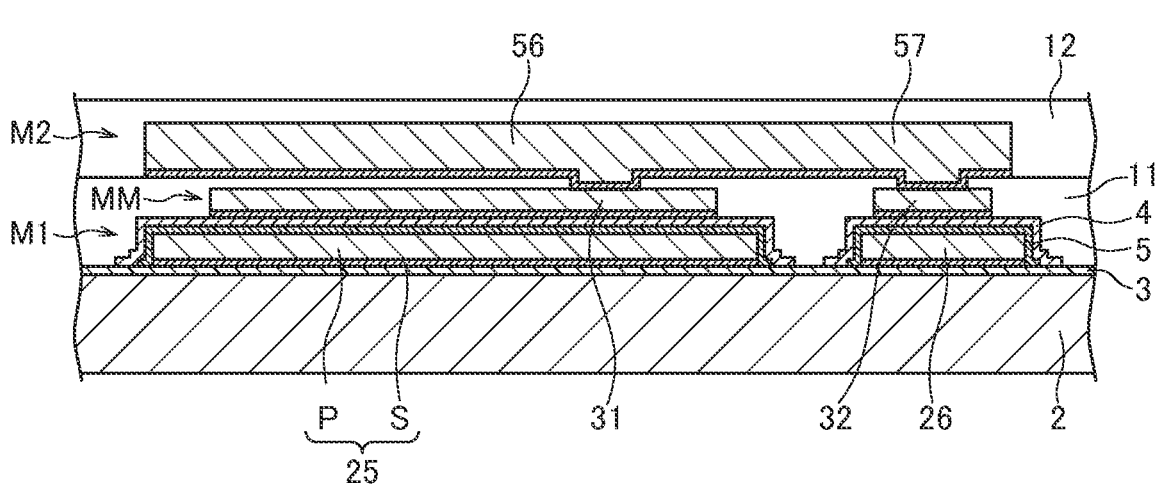
FIG. 2 is a schematic cross-sectional view taken along the line A-A in FIG. 1.

FIG. 1 is a schematic plan view for explaining the structure of an electronic component 1 according to an embodiment of the present disclosure. FIG. 2 is a schematic cross-sectional view taken along the line A-A in FIG. 1.

Figure 3:
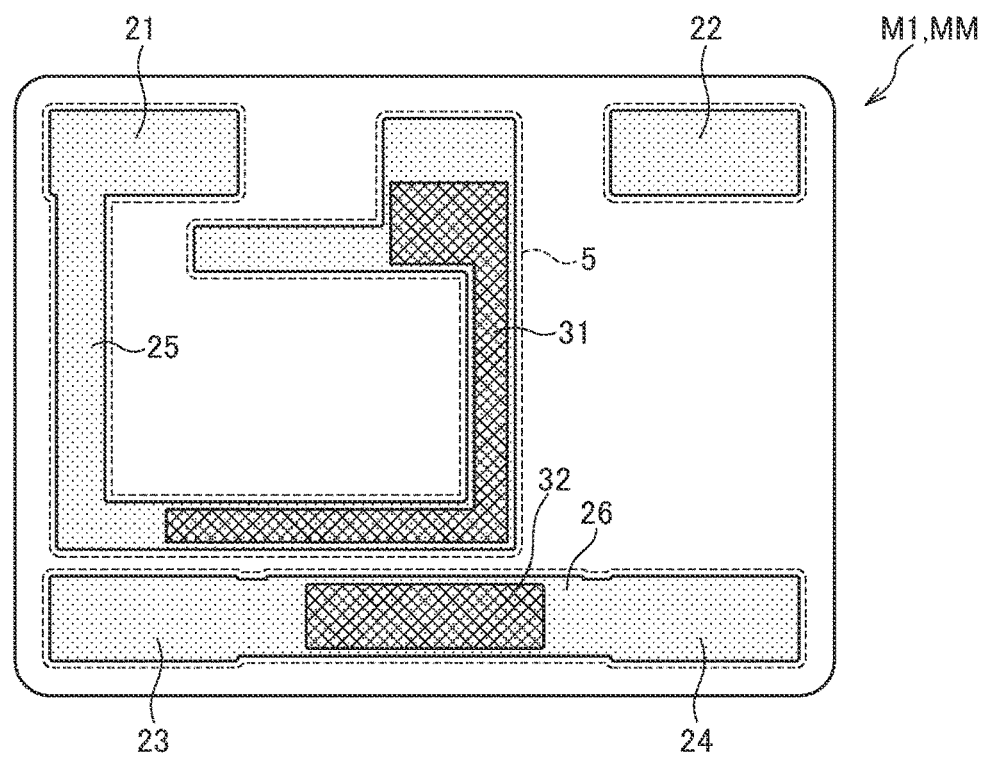
FIG. 3 is a schematic plan view for illustrating the pattern shapes of conductor layers M1 and MM.
Figure 4:
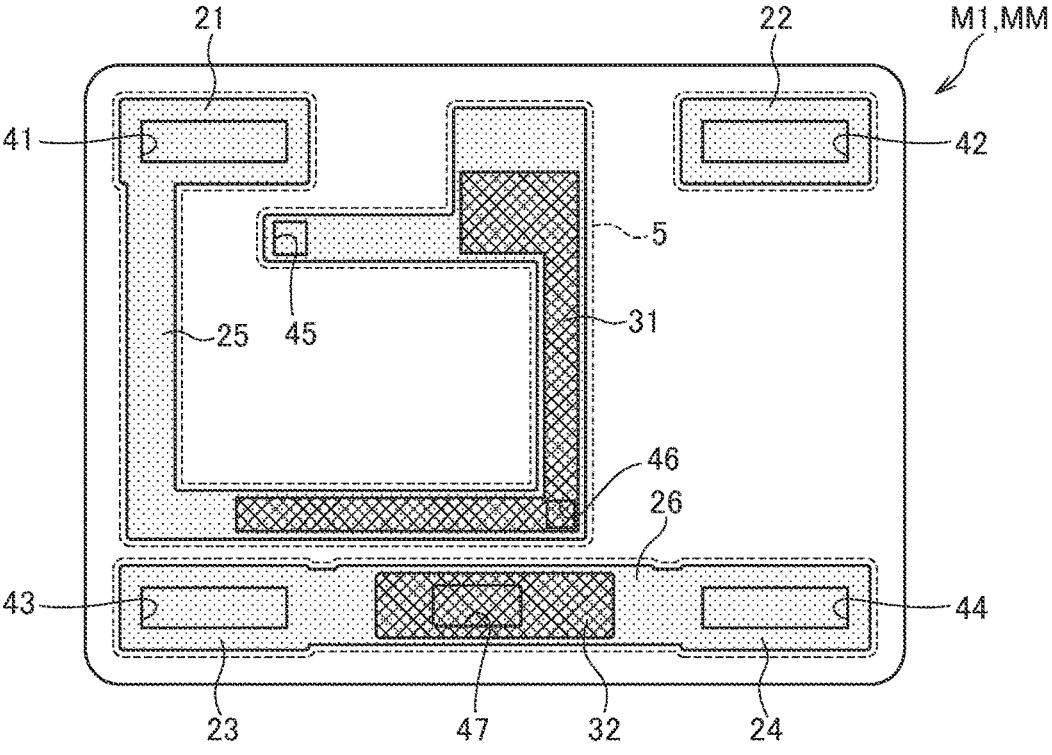
FIG. 4 is a schematic plan view for illustrating the position of a via formed in an insulating layer 11.
Figure 5:
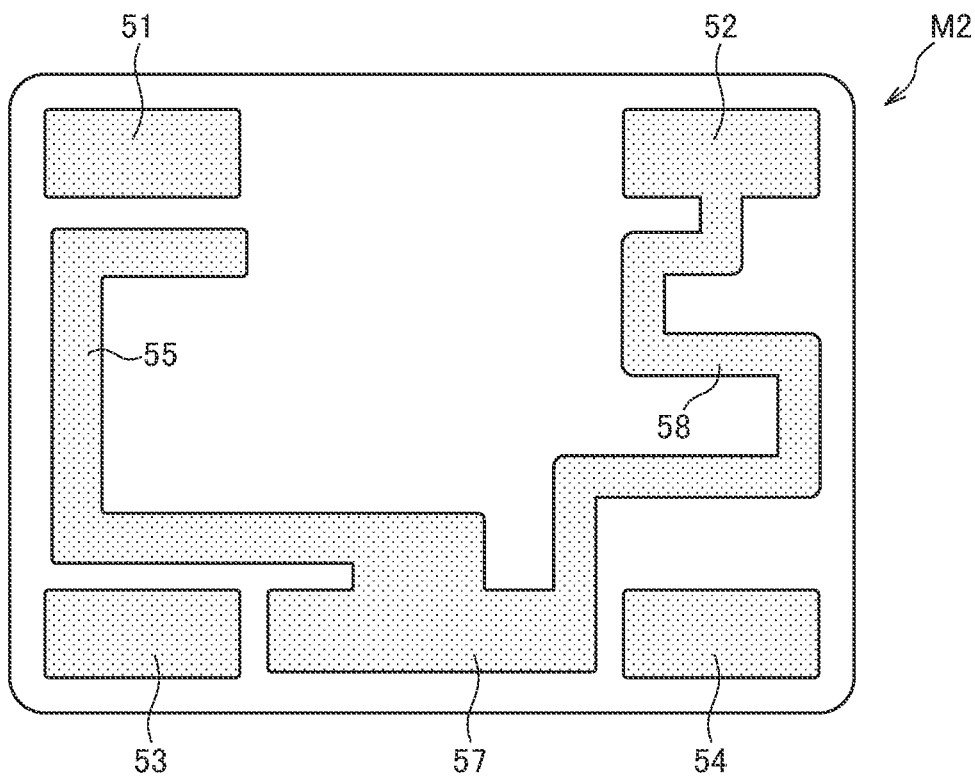
FIG. 5 is a schematic plan view for illustrating the pattern shape of a conductor layer M2.

In some embodiments, the electronic component 1 is an LC filter and includes, as illustrated in FIGS. 1 and 2, a substrate 2, conductor layers M1, MM, and M2, and insulating layers 11 and 12. The conductor layers M1, MM and M2 and insulating layers 11 and 12 are formed above the main surface of the substrate 2. The pattern shapes of the conductor layers M1 and MM are illustrated in FIG. 3, the position of a via formed in the insulating layer 11 is illustrated in FIG. 4, and the pattern shape of the conductor layer M2 is illustrated in FIG. 5. The material of the substrate 2 may be any material as long as it is chemically and thermally stable, generates less stress, and can maintain surface smoothness, and examples thereof include, but not particularly limited thereto, silicon single crystal, alumina, sapphire, aluminum nitride, MgO single crystal, $SrTiO_3$ single crystal, surface-oxidized silicon, glass, quartz, ferrite, organic film, or the like. The surface of the substrate 2 is covered with a planarizing layer 3. The planarizing layer 3 may be made of, e.g., alumina or silicon oxide.

The conductor layer M1 is a layer positioned in the lowermost layer and includes, as illustrated in FIG. 3, conductor patterns 21 to 26. The conductor patterns 21 to 24 each serve as a terminal electrode pattern, the conductor pattern 25 having a loop-like shape serves as both an inductor pattern and a capacitor lower electrode, and the conductor pattern 26 serves as a capacitor lower electrode. One end of the conductor pattern 25 is connected to the conductor pattern 21. The conductor pattern 26 is connected to the conductor patterns 23 and 24. These conductor patterns 21 to 26 are each formed from a thin seed layer S and a plating layer P. The seed layer S contacts the planarizing layer 3 and contains titanium (Ti), chrome (Cr), or tantalum (Ta). The plating layer P is provided on the seed layer S, made of copper (Cu) or the like, and has a film thickness larger than that of the seed layer S. Similarly, the conductor patterns positioned in other conductor layers MM and M2 are each formed of a laminated body of the seed layer S containing Ti, Cr, or Ta and plating layer P made of Cu or the like.

Of the conductor patterns 21 to 26, at least the conductor patterns 25 and 26 constituting the capacitor lower electrode are covered at its top and side surfaces with a dielectric film (capacitive insulating film) 4 through an adhesive film 5. The dielectric film 4 is made of an inorganic material such as silicon nitride. The adhesive film 5, which is made of at least one of Ti, Cr, Ta, an oxide thereof, and a nitride thereof, is disposed between the conductor layer M1 and the dielectric film 4 to act to prevent peeling at the interface between the silicon nitride and Cu, these being low in adhesion to each other. In particular, the adhesive film 5 covers not only the top surface of the conductor layer M1 but also the side surfaces thereof to thereby prevent peeling of the dielectric film 4 in a wide range. As illustrated in FIG. 3, the top and side surfaces of the conductor layer M1 are entirely covered with the adhesive film 5 except for a connection portion with the upper conductor layer.

Conductor patterns 31 and 32 are formed respectively on the top surfaces of the conductor patterns 25 and 26 through the dielectric film 4. The conductor patterns 31 and 32 belong to the conductor layer MM positioned between the conductor layers M1 and M2 to form a capacitor upper electrode. This forms a capacitor having the conductor pattern 25 as the lower electrode and the conductor pattern 31 as the upper electrode and a capacitor having the conductor pattern 26 as the lower electrode and the conductor pattern 32 as the upper electrode. The conductor layer MM is smaller in thickness than the conductor layers M1 and M2, whereby the pattern accuracy of the conductor layer MM is enhanced. The conductor layers M1 and MM are covered with an insulating layer 11 made of a resin material such as polyimide.

As illustrated in FIG. 4, vias 41 to 47 are formed in the insulating layer 11 so as to expose the conductor layers M1 and MM. The vias 41 to 44 are formed at positions exposing respectively the conductor patterns 21 to 24, the via 45 is formed at a position exposing the end portion of the conductor pattern 25, and the vias 46 and 47 are formed at positions exposing respectively the conductor patterns 31 and 32.

The conductor layer M2 is the second conductor layer, which is provided on the surface of the insulating layer 11 and includes conductor patterns 51 to 58 as illustrated in FIG. 5. The conductor patterns 51 to 54 each serve as a terminal electrode pattern, the conductor pattern 55 having a loop-like shape serves an inductor pattern, the conductor pattern 57 serves as a lead-out pattern for the upper electrode, and the conductor pattern 58 having a meander shape serves as an inductor pattern. The conductor patterns 51 to 54 are connected to the conductor patterns 21 to 24 respectively through the vias 41 to 44. One end of the conductor pattern 55 is connected to the other end of the conductor pattern 25 through the via 45, and the other end of the conductor pattern 55 is connected to the conductor pattern 57 and to the conductor pattern 31 through the via 46. The conductor pattern 57 is connected to the conductor pattern 32 through the via 47.

Figure 6:
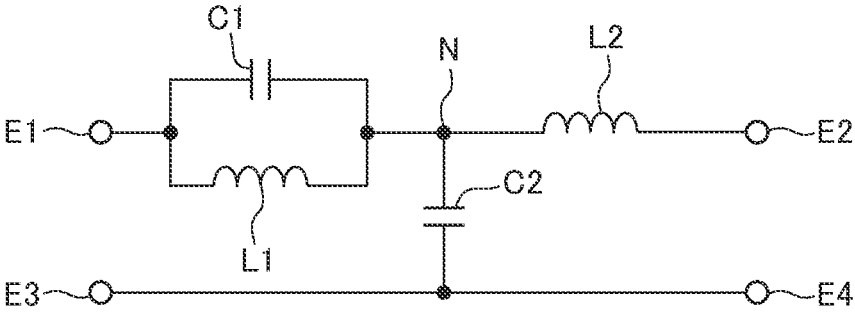
FIG. 6 is an equivalent circuit diagram of the electronic component 1.

FIG. 6 is an equivalent circuit diagram of the electronic component 1 according to the first embodiment.

As illustrated in FIG. 6, the electronic component 1 according to some embodiments has a circuit configuration in which a capacitor C1 and an inductor L1 are connected in parallel to each other between a terminal electrode E1 and an internal node N, an inductor L2 is connected between a terminal electrode E2 and the internal node N, and a capacitor C2 is connected between terminal electrodes E3, E4 and the internal node N. The terminal electrode E1 corresponds to the conductor patterns 21 and 51, the terminal electrode E2 corresponds to the conductor patterns 22 and 52, the terminal electrode E3 corresponds to the conductor patterns 23 and 53, and the terminal electrode E4 corresponds to the conductor patterns 24 and 54. The internal node N corresponds to the conductor pattern 57. The capacitor C1 uses a part of the conductor pattern 25 as its lower electrode and uses the conductor pattern 31 as its upper electrode. The capacitor C2 uses a part of the conductor pattern 26 as its lower electrode and uses the conductor pattern 32 as its upper electrode. The inductor L1 is formed by the conductor patterns 25 and 55, and the inductor L2 is formed by the conductor pattern 58.

When the conductor layer M2 constituting an inductor pattern thus exists in the upper layer of the conductor layers M1 and MM constituting a capacitor, not only stress of the insulating layer 11 covering the conductor layers M1 and MM, but also stress of the insulating layer 12 covering the conductor layer M2 is applied, so that peeling is more likely to occur at the interface where the degree of adhesion is low. Such a problem becomes more conspicuous when the inductor pattern is formed using more conductor layers.

However, in the electronic component 1, the adhesive film 5 is disposed between the conductor layer M1 and the dielectric film 4 which are most likely to peel away each other. This configuration enables to prevent peeling at the interface between the conductor layer M1 and the dielectric film 4. The adhesive film 5 need not be entirely covered with the dielectric film 4 and may be partly exposed from the dielectric film 4. The adhesive film 5 exposed from the dielectric film 4 acts to enhance adhesion to the insulating layer 11.

The following describes a manufacturing method for the electronic component 1 according to some embodiments.

FIGS. 7 to 16 are process views for explaining the manufacturing method for the electronic component 1. Although a large number of the electronic components 1 are obtained from an aggregate substrate in the manufacturing process of the electronic component 1, the following description using FIGS. 7 to 16 will focus on the manufacturing process of a single electrode component 1.

Figure 7:
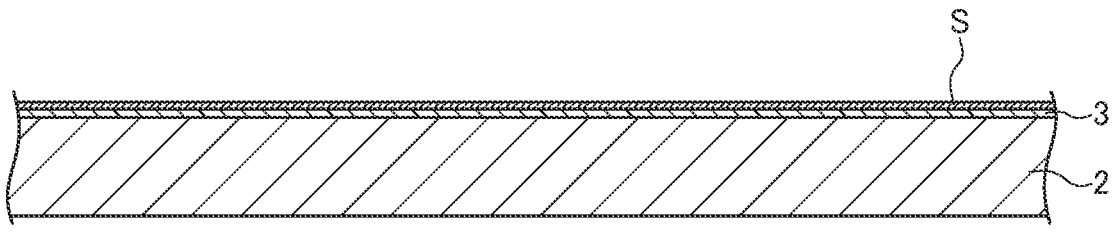
FIG. 7 is a process view for explaining the manufacturing method for the electronic component 1.
Figure 8:
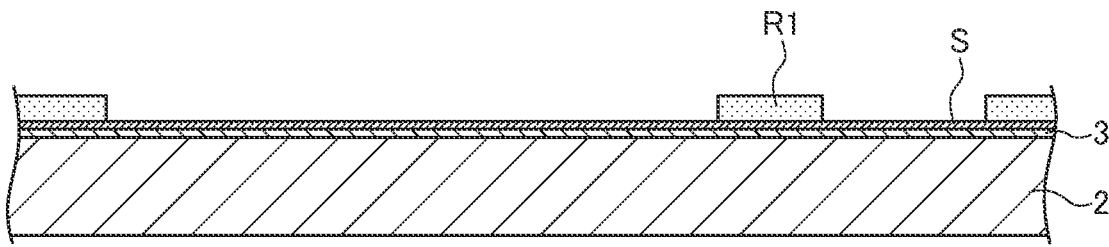
FIG. 8 is a process view for explaining the manufacturing method for the electronic component 1.
Figure 9:
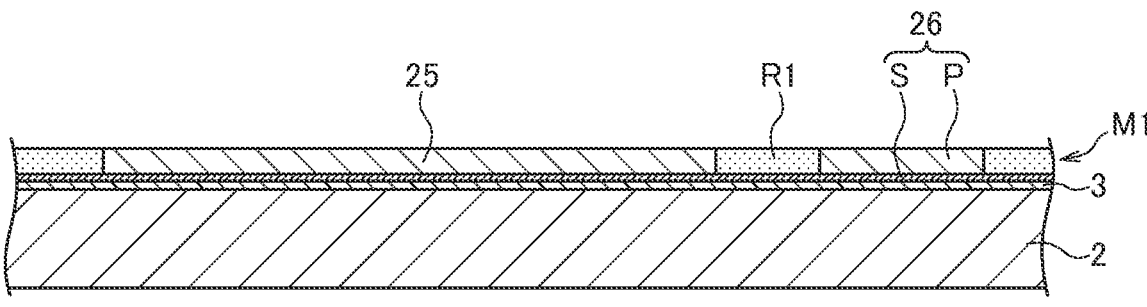
FIG. 9 is a process view for explaining the manufacturing method for the electronic component 1.
Figure 10:
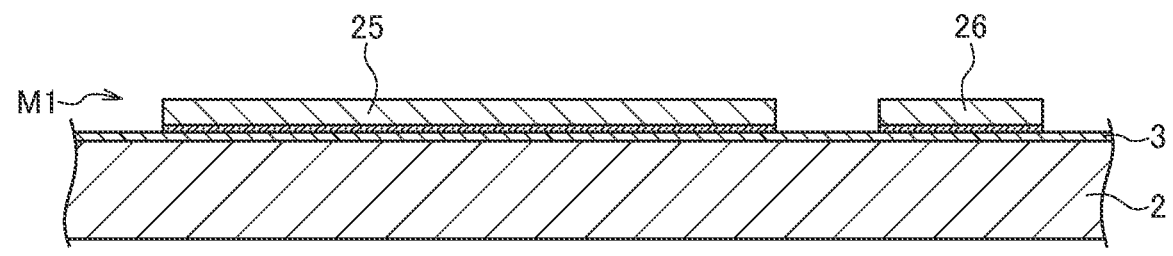
FIG. 10 is a process view for explaining the manufacturing method for the electronic component 1.

As illustrated in FIG. 7, a planarizing layer 3 is formed by sputtering or the like on the substrate (aggregate substrate) 2, and the surface thereof is subjected to grinding or mirror finishing such as CMP for planarization. Thereafter, a seed layer S is formed by sputtering or the like on the surface of the planarizing layer 3. Subsequently, as illustrated in FIG. 8, a resist layer R1 is spin-coated on the seed layer S and then patterned so as to expose a part of the seed layer S on which the conductor layer M1 is to be formed. In this state, electrolyte plating is performed using the seed layer S as a feed to form a plating layer P on the seed layer S as illustrated in FIG. 9. A laminated body of the seed layer S and plating layer P forms the conductor layer M1. In the cross section illustrated in FIG. 9, the conductor layer M1 includes the conductor patterns 25 and 26. Then, after removal of the resist layer R1 as illustrated in FIG. 10, the exposed seed layer S is removed, whereby the conductor layer M1 is completed. The removal of the seed layer S can be made by etching such as ion milling.

Figure 11:
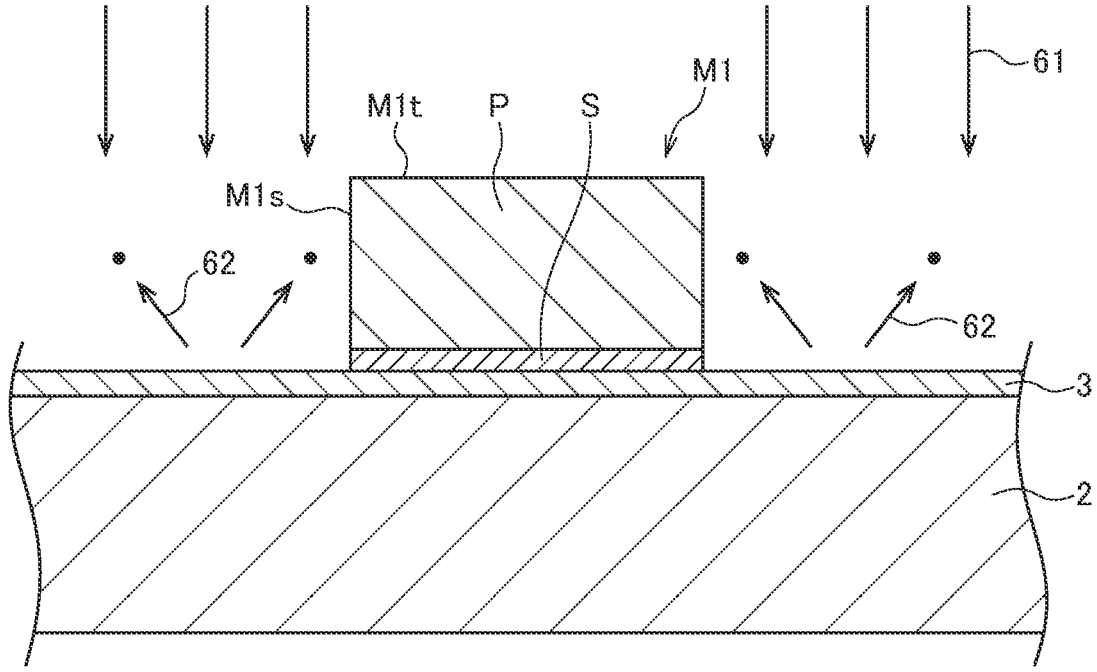
FIG. 11 is a process view for explaining the manufacturing method for the electronic component 1.

As illustrated in FIG. 11, when ion milling is used to remove the seed layer S, the seed layer S is first sputtered by irradiation of ion beam 61, and then an insulating material 62 constituting the planarizing layer 3 is sputtered. The sputtered seed layer S adheres in part to the side surface of the conductor layer M1, and the sputtered insulating material 62 adheres in part to the side surface of the conductor layer M1 with a conductive material forms the seed layer S disposed therebetween. As a result, a thin film including the seed layer S and insulating material 62, or an uneven shaped (concave-convex) portion formed from the partly adhering seed layer S and insulating material 62, is developed on a side surface M1s of the conductor layer M1. Such thin film or uneven shaped (concave-convex) portion developed on the side surface M1s of the conductor layer M1 enables to enhance adhesion between the conductor layer M1 and the adhesive film 5. On the other hand, the seed layer S and insulating material 62 sputtered by ion milling do not adhere to a top surface M1t of the conductor layer M1. Therefore, a variation in capacitance due to adhering of the seed layer S and insulating material 62 can be prevented.

Figure 12:
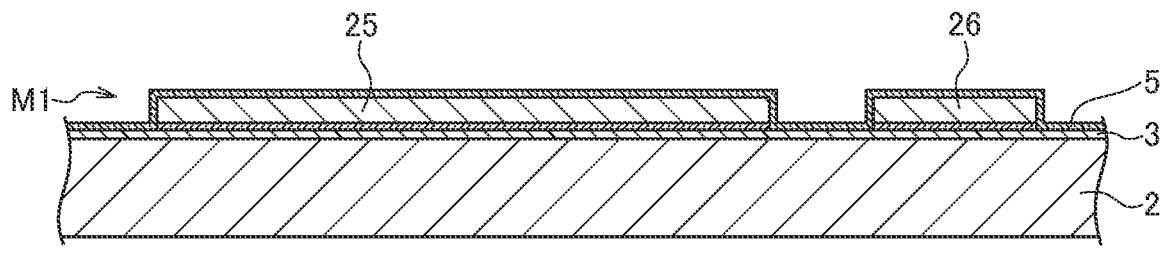
FIG. 12 is a process view for explaining the manufacturing method for the electronic component 1.
Figure 13:
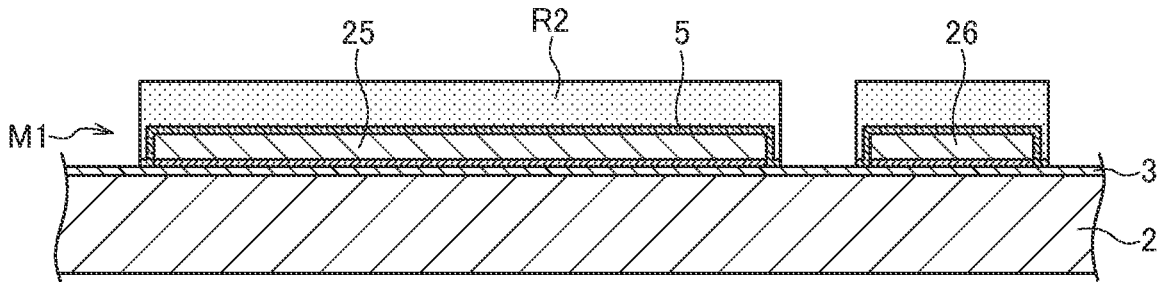
FIG. 13 is a process view for explaining the manufacturing method for the electronic component 1.

Then, as illustrated in FIG. 12, the adhesive film 5 made of Ti, Cr, or Ta is formed on the entire surface (including the top and side surfaces) of the conductor layer M1. Subsequently, as illustrated in FIG. 13, a resist layer R2 that covers the conductor layer M1 and its surrounding area is formed, followed by patterning of the adhesive film 5 using the resist layer R2 as a mask. As a result, the adhesive film 5 remains only on the top and side surfaces of the conductor layer M1 and the surrounding area thereof.

Figure 14:
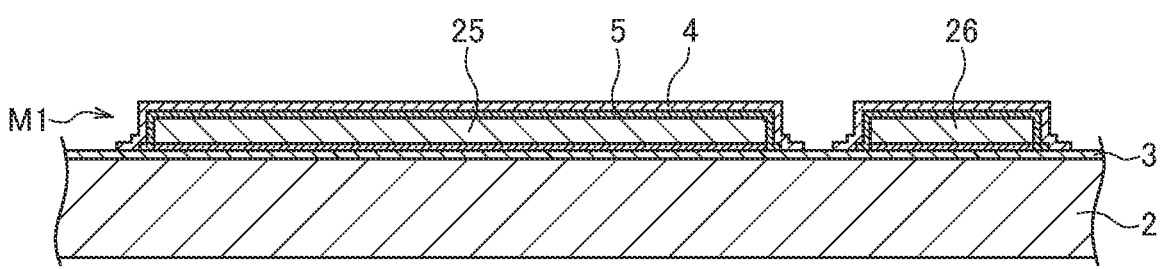
FIG. 14 is a process view for explaining the manufacturing method for the electronic component 1.

Then, as illustrated in FIG. 14, the dielectric film 4 is formed on the entire surface of the conductor layer M1. The dielectric film 4 may be formed of, for example, a paraelectric material such as silicon nitride (SiNx) or silicon oxide (SiOx) and other known ferroelectric material. The dielectric film 4 can be formed by sputtering, plasma CVD, MOCVD, sol-gel, electron beam vapor deposition, or the like. Thereafter, a part of the dielectric film 4 that does not function as a capacitor, including, for example, a part thereof that is formed on the surface of the planarizing layer 3 and the like, may be removed. By removing a part of the dielectric film 4 that does not function as a capacitor, stress of the dielectric film 4 is reduced correspondingly. A part of the dielectric film 4 that does not function as a capacitor also includes a part that covers a part (for example, conductor patterns 21 to 24) of the conductor layer M1 that does not function as the capacitor lower electrode. Removing such a part of the dielectric film 4 partly exposes the adhesive film 5.

Figure 15:
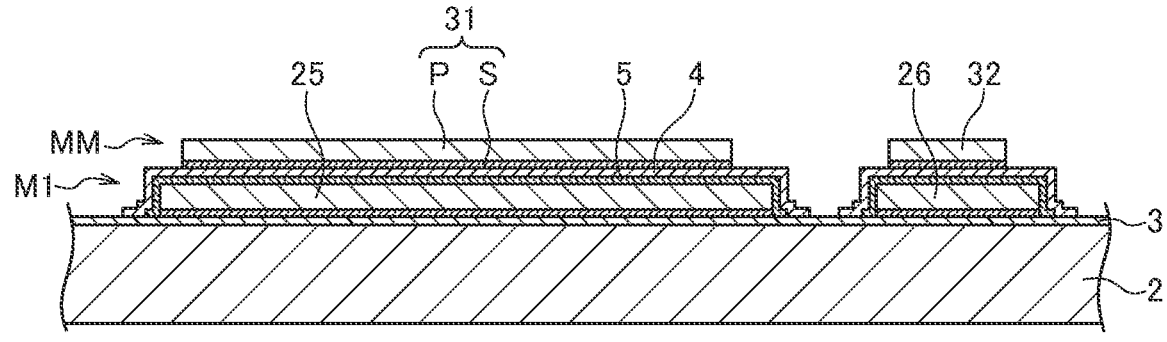
FIG. 15 is a process view for explaining the manufacturing method for the electronic component 1.

Then, as illustrated in FIG. 15, the same method as that for the conductor layer M1 is used to form the conductor patterns 31 and 32 on the top surfaces of the respective conductor patterns 25 and 26 through the dielectric film 4. The conductor patterns 31 and 32 are also formed of a laminated body of the seed layer S and plating layer P. This completes the conductor layer MM to thereby form a capacitor having the conductor patterns 25 and 26 as the lower electrode and the conductor patterns 31 and 33 as the upper electrode.

The seed layer S included in the conductor layer MM contains Ti, Cr, or Ta, as described above and thus has high adhesion to the dielectric film 4. The unnecessary portion of the seed layer S is removed by the method illustrated in FIG. 10. When the seed layer S included in the conductor layer MM is removed by ion milling, it partly remains on a vertical part of the dielectric film 4 that covers the side surface M1s of the conductor layer M1, as illustrated in a partly enlarged view of FIG. 16. The thus remaining part of the seed layer S functions as a second adhesive film 6. When the seed layer S included in the conductor layer MM and the adhesive film 5 are made of the same material, the dielectric film 4 is sandwiched between the same substances, so that the work functions of the seed layer S and adhesion film 5 become equal. Thus, bias dependence does not occur to result in symmetry between current and voltage in terms of positive and negative values.

Figure 16:
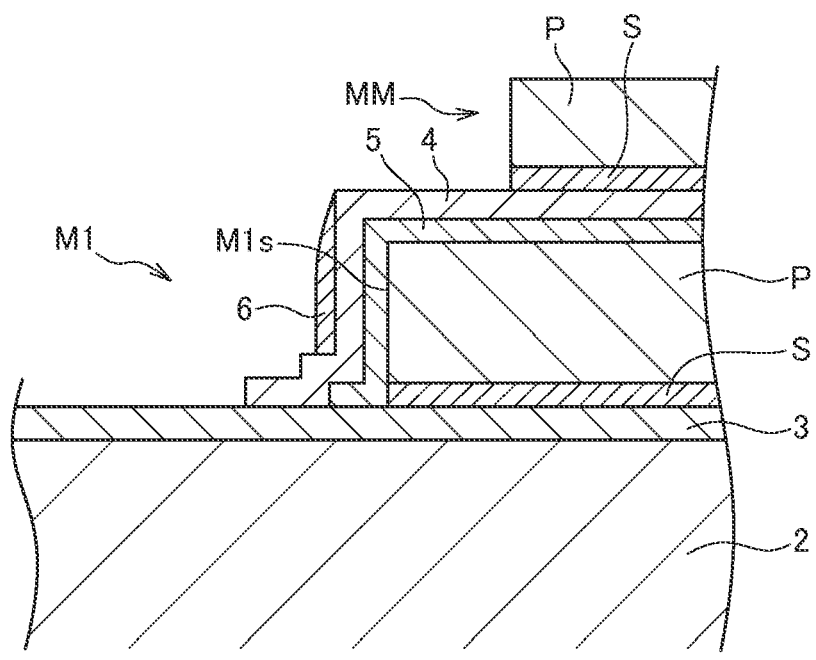
FIG. 16 is a process view for explaining the manufacturing method for the electronic component 1.

Then, after formation of the insulating layer 11 covering the conductor layers M1 and MM, the vias 41 to 47 illustrated in FIG. 4 are formed in the insulating layer 11, and the conductor layer M2 and insulating layer 12 are sequentially formed, whereby the electronic component 1 according to the present embodiment is completed. When a part of the seed layer S is made to remain on a vertical part of the dielectric film 4 that covers the side surface M1s of the conductor layer M1 as illustrated in FIG. 16, it functions as the adhesive film 6 to the insulating layer 11, making peeling less likely to occur at the interface of the insulating layer 11.

While some embodiments of the present disclosure has been described above, the present disclosure is not limited to the above embodiments, and various modifications may be made within the scope of the present disclosure, and all such modifications are included in the present disclosure.

The technology according to the present disclosure includes the following configuration examples but not limited thereto.

An electronic component according to the present disclosure includes: a first conductor layer formed on a substrate and including a lower electrode of a capacitor; a dielectric film covering the top and side surfaces of the lower electrode; an upper electrode of the capacitor covering the top surface of the lower electrode with the dielectric film disposed therebetween; and a first adhesive film interposed between the dielectric film and the top and side surfaces of the lower electrode.

According to the electronic component, the first adhesive film is disposed between the dielectric film and the top and side surfaces of the lower electrode, thereby making it possible to prevent peeling at the interface between the dielectric film and the lower electrode.

In some embodiments, the electronic component may further include a first insulating layer with the first conductor layer and the upper electrode being embedded therein, a second conductor layer formed on the first insulating layer and including an inductor pattern, and a second insulating layer with the second conductor layer being embedded therein. In such a structure, the peeling at the interface between the dielectric film and the lower electrode can be prevented by the presence of the first adhesive film.

In some embodiments, the first adhesive film may include at least one of Ti, Cr, Ta, an oxide thereof, and a nitride thereof. This configuration enables high adhesion to both the lower electrode made of, e.g., Cu and the dielectric film made of, e.g., an inorganic material.

In some embodiments, the upper electrode may have a laminated structure of a seed layer contacting the dielectric film and a plating layer formed on the seed layer. The seed layer may include Ti, Cr, or Ta. In the embodiment, a second adhesive film formed from the same material as the seed layer may be disposed between a part of the dielectric film that covers the side surface of the lower electrode and the first insulating layer. This configuration enables to reduce peeling at the interface of the first insulating layer.

In some embodiments, the electronic component may further include a planarizing layer disposed between the substrate and the first conductor layer, and an insulating material forming the planarizing layer may adhere to the side surface of the lower electrode. This configuration enables to enhance adhesion between the side surface of the lower electrode and the first adhesive film. In this case, a conductive material forming a seed layer included in the first conductor layer may be disposed between the side surface of the lower electrode and the insulating material constituting the planarizing layer.

As described above, according to the present disclosure, an electronic component including a capacitor with improved reliability can be provided, for example, by preventing peeling between the capacitor lower electrode and the dielectric film.

REFERENCE SIGNS LIST 1 electronic component
2 substrate
3 planarizing layer
4 dielectric film
5 first adhesive film
6 second adhesive film
11, 12 insulating layer
21-26, 31, 32, 51-58 conductor pattern
41-47 via
61 ion beam
62 insulating material
C1, C2 capacitor
E1-E4 terminal electrode
L1, L2 inductor
M1, MM, M2 conductor layer
M1s side surface of conductor layer
M1t top surface of the conductor layer
N internal node
P plating layer
R1, R2 resist layer
S seed layer

What is claimed is:

1. An electronic component comprising:
a first conductor layer formed on a substrate and including a lower electrode of a capacitor;
a dielectric film covering top and side surfaces of the lower electrode;
an upper electrode of the capacitor covering the top surface of the lower electrode with the dielectric film disposed therebetween;
a first adhesive film disposed between the dielectric film and the top and side surfaces of the lower electrode;
a first insulating layer formed on the substrate, the first conductor layer and the upper electrode being embedded in the first insulating layer;
a second conductor layer formed on the first insulating layer and including an inductor pattern; and
a second insulating layer formed on the second insulating layer, the second conductor layer being embedded in the second insulating layer,
wherein the first adhesive film includes at least one of Ti, Cr, Ta, an oxide thereof, and a nitride thereof, wherein the upper electrode has a laminated structure of a seed layer and a plating layer formed on the seed layer, the seed layer includes Ti, Cr, or Ta and being arranged to contact the dielectric film, and wherein the electronic component further comprises a second adhesive film being disposed between a part of the dielectric film that covers the side surface of the lower electrode and the first insulating layer, the second adhesive film being formed from a same material as the seed layer.

2. An electronic component comprising:

a substrate;

a lower electrode formed on a substrate, the lower electrode having a laminated structure of a first seed layer and a first plating layer formed on the first seed layer;

a first adhesive film including a horizontal section formed on a top surface of the lower electrode and a vertical section formed on a side surface of the lower electrode;

a dielectric film including a horizontal section covering the top surface of the lower electrode via the horizontal section of the first adhesive film and a vertical section covering the side surface of the lower electrode via the vertical section of the first adhesive film;

an upper electrode covering the top surface of the lower electrode via the horizontal section of the first adhesive film and the horizontal section of the dielectric film, the upper electrode having a laminated structure of a second seed layer and a second plating layer formed on the second seed layer;

a second adhesive film formed on the vertical section of the dielectric film such that the vertical section of the dielectric film is sandwiched between the vertical section of the first adhesive film and the second adhesive film; and an insulating layer formed on the substrate so as to embed therein the lower electrode and the upper electrode.

3. The electronic component as claimed in claim 2, wherein each of the first and second adhesive films has an electrical conductivity.

4. The electronic component as claimed in claim 2, wherein the second adhesive film includes a same conductive material included in the second seed layer.

5. The electronic component as claimed in claim 2, wherein a conductive material included in the first seed layer adheres to the side surface of the lower electrode.

6. The electronic component as claimed in claim 5, further comprising a planarizing layer disposed between the substrate and the lower electrode, wherein an insulating material included in the planarizing layer adheres to the side surface of the lower electrode.

* * * * *